United States Patent [19]
Han

[11] Patent Number: 5,508,961
[45] Date of Patent: Apr. 16, 1996

[54] BIT LINE LOAD CIRCUIT

[75] Inventor: Gwang M. Han, Bubaleub, Rep. of Korea

[73] Assignee: Hyundai Electronics Industries Co., Ltd., Kyoungkido, Rep. of Korea

[21] Appl. No.: 174,201

[22] Filed: Dec. 27, 1993

[30]    Foreign Application Priority Data

Dec. 30, 1992 [KR]   Rep. of Korea ............... 1992-26840

[51] Int. Cl.⁶ ........................................ G11C 7/00
[52] U.S. Cl. ........................ 365/189.06; 365/189.11; 365/190
[58] Field of Search .................. 365/189.06, 189.11, 365/203, 190

[56]    References Cited

U.S. PATENT DOCUMENTS

| | | | |
|---|---|---|---|
| 4,386,419 | 5/1983 | Yamamoto | 365/203 |
| 4,802,128 | 1/1989 | Watanabe et al. | 365/203 |
| 4,985,864 | 1/1991 | Price | 365/189.06 |
| 5,126,974 | 6/1992 | Sasaki et al. | 365/189.06 X |
| 5,305,264 | 4/1994 | Takahashi | 365/189.11 X |

*Primary Examiner*—David C. Nelms
*Assistant Examiner*—Son Dinh
*Attorney, Agent, or Firm*—Darby & Darby

[57]    ABSTRACT

A bit line load circuit for a static random access memory comprising first and second P-channel MOSFETs for clamping a voltage difference between first and second bit lines at a predetermined level in a data reading operation and third and fourth P-channel MOSFETs for blocking a DC current flow to one of the first and second bit lines having a "low" level and performing a voltage compensation for the other having a "high" level in a data writing operation. The first bit line is active "high" and the second bit line is active "low". The first P-channel MOSFET has a drain connected to the first bit line, a source connected to a power source line and a gate connected to a write enable signal, the second P-channel MOSFET has a drain connected to the second bit line, a source connected to the power source line and a gate connected to the write enable signal, the third P-channel MOSFET has a drain connected to the first bit line, a source connected to the power source line and a gate cross-connected to the second bit line arid the fourth P-channel MOSFET has a drain connected to the second bit line, a source connected to the power source line and a gate cross-connected to the first bit line.

1 Claim, 3 Drawing Sheets

BIT LINE LOAD CIRCUIT

BACKGROUND OF THE INVENTION

1. Field of the Invention

The present invention relates in general to a memory core circuit for a static random access memory (SRAM), and more particularly to a bit line load circuit of the memory core circuit.

2. Description of the Prior Art

Referring to FIG. 1A, there is shown a circuit diagram of a conventional bit line load circuit of a memory core circuit for a SRAM. It should be noted herein that only one column of the memory core circuit, is shown in FIG. 1A.

In FIG. 1A, the bit line load circuit is designated by the reference numeral 11. The bit, line load circuit comprises a pair of P-channel MOSFETs Q1 and Q2 adapted to clamp a voltage difference between bit, lines B and /B at a predetermined level in a data reading operation. The bit lines B and /B have the opposite levels. Namely, the bit line B is active "high" and the bit line /B is active "low".

However, the conventional bit line load circuit has a disadvantage in that a direct current (DC) static current flows in a data writing operation because the P-channel MOSFETs Q1 and Q2 always remain at their ON states. Namely, in the data writing operation, data input transfer signals D and /D of the opposite levels are transferred respectively to the bit lines B and /B through a Y-pass gate, which is comprised of transistors Q3-Q6. The Y-pass gate acts to perform a column selection. In this case, one of the data input transfer signals D and /D has data of logical "1" and the other has data of logical "0". As a result, any one of the data input transfer signals D and /D necessarily has data of logical "0" and the DC static current flows along the "0" data path.

For example, in the case where data of logical "1" is to be written, the data input transfer signal D becomes logical "1", the data input transfer signal /D becomes logical "0" and a write enable signal WE becomes logical "1". Subsequently, transistors Q7 and Q8 are turned on, a signal Y of the selected column goes logical "1" and a signal /Y of the selected column goes logical "0". As a result, the transistors Q3-Q6 are turned on, thereby causing the DC static current to be continuously consumed through the path of the transistors Q2 and Q4 and Q6 and Q8.

On the contrary, in the case where data of logical "0" is to be written, the DC static current consumption path is formed along the transistors Q1 and Q3 and Q5 and Q7 in the opposite side to that in the logical "1" data. In result, the DC current is always present in the data writing operation. The current consumption is doubled in a product of a multi-bit manner.

Referring to FIG. 1B, there is shown a circuit diagram of another conventional bit line load circuit, which has been made in view of the above problem with the conventional bit line load circuit of FIG. 1A. In this drawing, the bit line load circuit is designated by the reference numeral 12. As shown in this drawing, the write enable signal WE is applied to gates of the transistors Q1 and Q2 so that the transistors Q1 and Q2 can be turned off in the data writing operation. The transistors Q3 and Q4 are small in size and always remain at their ON states to compensate for a leakage current in the data writing operation. However, in this case, the DC current flows through the transistors Q3 and Q4, resulting in a failure in the perfect blockage.

SUMMARY OF THE INVENTION

Therefore, the present invention has been made in view of the above problems, and it is an object of the present invention to provide a bit line load circuit which is capable of perfectly blocking a DC static current in a data writing operation with no change in the function of the conventional bit line load circuit and with no increase in the number of MOSFETs thereof.

In accordance with one aspect of the present invention, there is provided a bit line load circuit for a static random access memory comprising first and second P-channel MOSFETs for clamping a voltage difference between first and second bit lines at a predetermined level in a data reading operation, said first bit line being active "high", said second bit line being active "low", said first P-channel MOSFET having a drain connected to said first bit line, a source connected to a power source line and a gate connected to a write enable signal, said second P-channel MOSFET having a drain connected to said second bit line, a source connected to said power source line and a gate connected to the write enable signal; and third and fourth P-channel MOSFETs for blocking a DC current flow to one of said first and second bit lines having a "low" level and performing a voltage compensation for the other having a "high" level in a data writing operation, said third P-channel MOSFET having a drain connected to said first bit line, a source connected to said power source line and a gate cross-connected to said second bit line, said fourth P-channel MOSFET having a drain connected to said second bit line, a source connected to said power source line and a gate cross-connected to said first bit line.

In accordance with another aspect of the present invention, there is provided a bit line load circuit for a static random access memory comprising first and second N-channel MOSFETs for clamping a voltage difference between first and second bit lines at a predetermined level in a data reading operation, said first bit line being active "high", said second bit line being active "low", said first N-channel MOSFET having a source connected to said first bit line, a drain connected to a power source line and a gate connected to an inverted one of a write enable signal, said second N-channel MOSFET having a source connected to said second bit line, a drain connected to said power source line and a gate connected to the inverted write enable signal; and third and fourth N-channel MOSFETs for blocking a DC current flow to one of said first and second bit lines having a "low" level and performing a voltage compensation for the other having a "high" level in a data writing operation, said third N-channel MOSFET having a drain connected to said power source line, a source connected to said first bit line and a gate cross-connected to said second bit line through a first inverter, said fourth N-channel MOSFET having a drain connected to said power source line, a source connected to said second bit line and a gate cross-connected to said first bit line through a second inverter.

In accordance with yet another aspect of the present invention, there is provided a bit line load circuit for a static random access memory comprising first and second N-channel MOSFETs for clamping a voltage difference between first and second bit lines at a predetermined level in a data reading operation, said first bit line being active "high", said second bit line being active "low", said first N-channel MOSFET having a source connected to said first bit line, a drain connected to a power source line and a gate connected to an inverted one of a write enable signal, said second N-channel MOSFET having a source connected to said second bit line, a drain connected to said power source line and a gate connected to the inverted write enable signal; a third N-channel MOSFET having a gate and a drain connected in common to said power source line; and first and second P-channel MOSFETs for blocking a DC current flow to one of said first and second bit lines having a "low" level and performing a voltage compensation for the other having a "high" level in a data writing operation, said first P-channel MOSFET having a source connected to a source of said third N-channel MOSFET, a drain connected to said first bit line and a gate cross-connected to said second bit line, said second P-channel MOSFET having a source connected to the source of said third N-channel MOSFET, a drain connected to said second bit line and a gate cross-connected to said first bit line.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 1A:
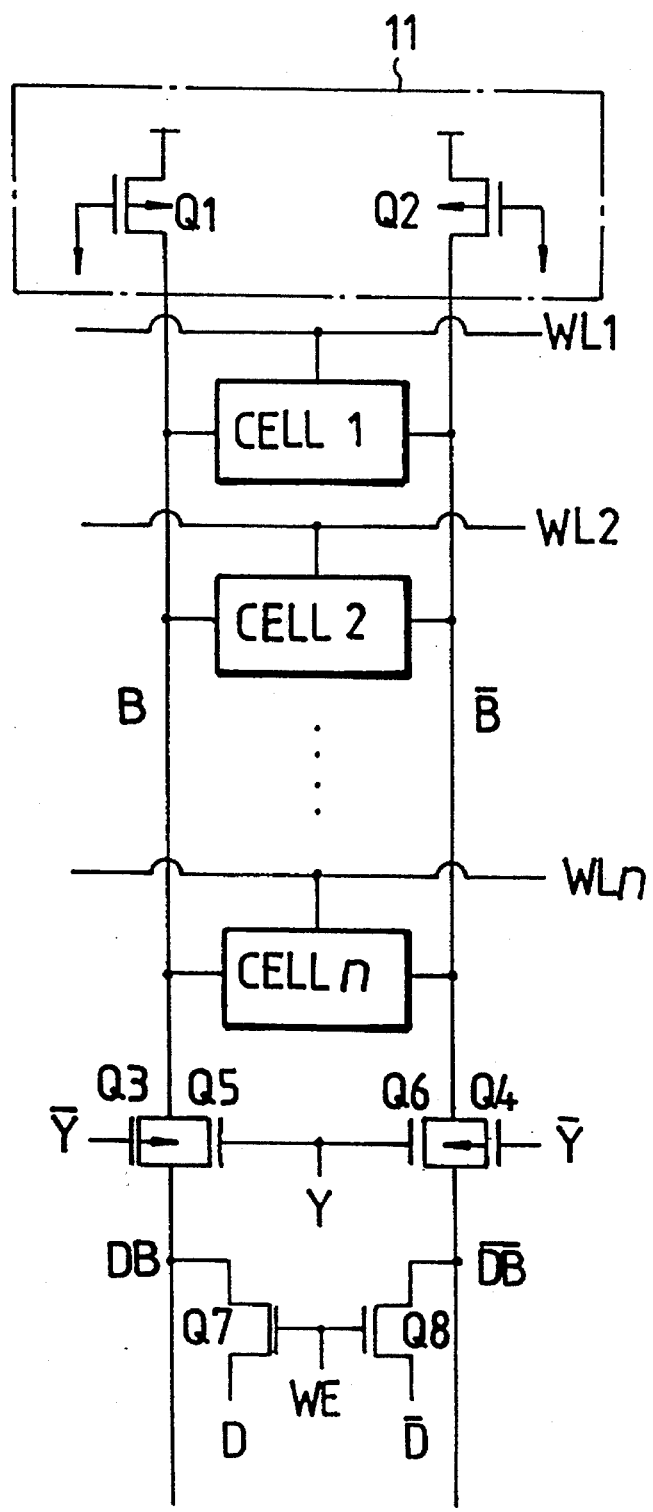
FIG. 1A is a circuit diagram of a conventional bit line load circuit of a memory core circuit for a SRAM.
Figure 1B:
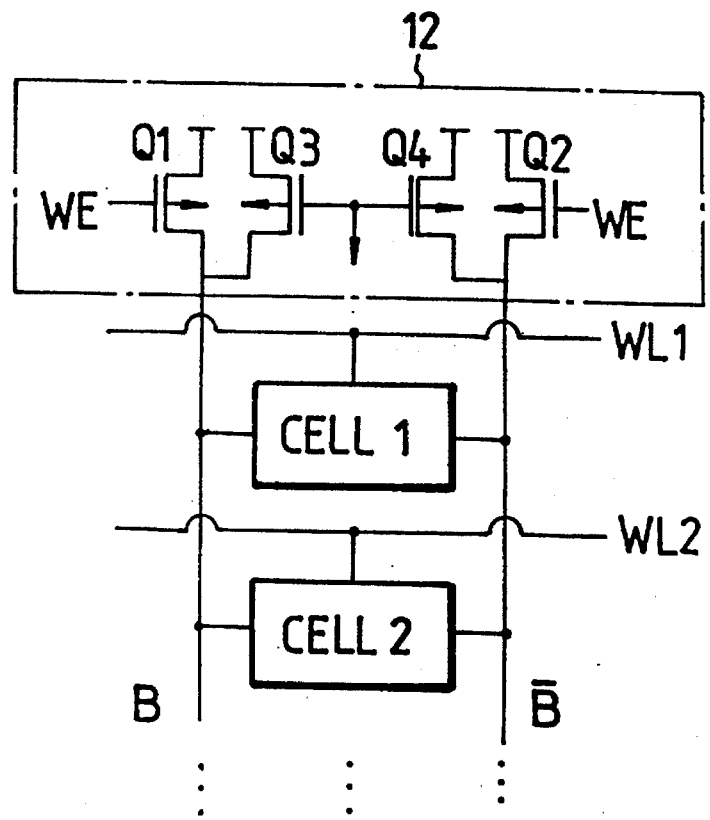
FIG. 1B is a circuit diagram of another conventional bit line load circuit.
Figure 2:
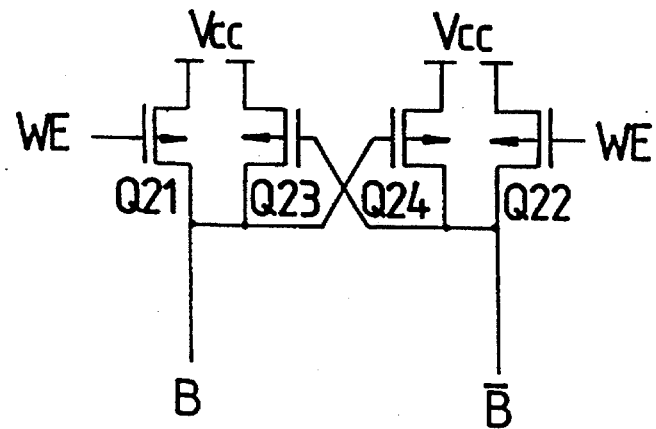
FIG. 2 is a circuit diagram of a bit line load circuit in accordance with a first embodiment of the present invention.

Referring to FIG. 2, there is shown a circuit diagram of a bit line load circuit in accordance with a first embodiment of the present invention. Some of parts in this drawing are the same as those in FIGS. 1A and 1B. Therefore, like reference numerals designate like parts.

In FIG. 2, the bit line load circuit comprises P-channel MOSFETs Q21 and Q22 which are driven in the same manner as those of the P-channel MOSFETs Q1 and Q2 in FIG. 1B. When the write enable signal is logically "0" or in the data reading operation, the P-channel MOSFETs Q21 and Q22 are turned on to clamp the voltage difference between the bit lines B and /B at the predetermined level. On the contrary, in the data writing operation, the P-channel MOSFETs Q21 and Q22 are turned off because the write enable signal WE is logically "1".

The bit line load circuit comprises P-channel MOSFETs Q23 and Q24 in addition to the P-channel MOSFETs Q21 and Q22. The P-channel MOSFET Q23 has a source connected to a power source line Vcc, a drain connected to the bit line B and a gate cross-connected to the bit line /B. The P-channel MOSFET Q24 has a source connected to the power source line Vcc, a drain connected to the bit line /B and a gate cross-connected to the bit line B. Namely, the P-channel MOSFETs Q23 and Q24 are in the form of cross-coupled loads.

Voltage levels of the bit lines B and /B are determined by cells and bit line loads or the P-channel MOSFETs Q21 and Q22 in the data reading operation. The "1" level is a voltage from the power source line Vcc and the "0" level is a voltage of Vcc-$\Delta$V (voltage difference between the bit lines B and /B). Typically, $\Delta$V is about 300 mV. As a result, the P-channel MOSFETs Q23 and Q24 are at their open states. Although $\Delta$V becomes higher than a threshold voltage of the P-channel MOSFETs Q23 and Q24, it has no effect on the data reading operation because the P-channel MOSFETs Q23 and Q24 are small in size to compensate for a leakage current in the data writing operation. Namely, Q21 and Q22>>Q23 and Q24.

In the data writing operation, in the case where "high" data is written in the bit line B and "low" data is written in the bit line /B, the P-channel MOSFET Q24 is turned off because its gate inputs the "1" signal from the bit line B. As a result, such a DC current as in FIG. 1B is not generated through the P-channel MOSFET Q24. This has the effect of perfectly blocking the static DC current from the bit line loads.

Also, because the P-channel MOSFET Q23 is ON, it can compensate for the dropping of the "high" voltage of the bit line B resulting from the leakage current. In the case where the input data have the opposite levels to those in the above-mentioned case, the operating principles are the same with the exception that, the roles of the P-channel MOSFETs Q23 and Q24 are changed to the contrary. Therefore, the detailed description will be omitted.

Figure 3:
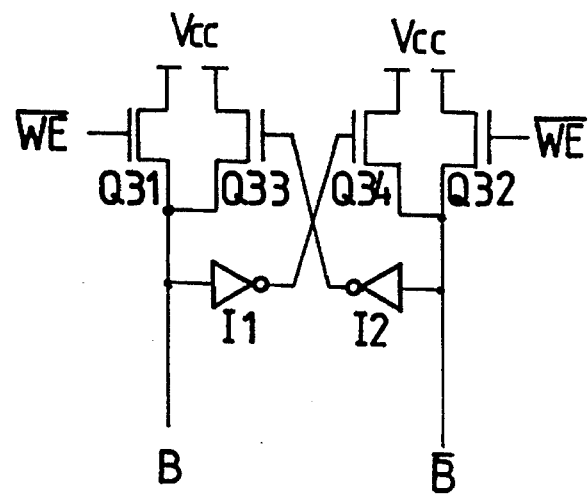
FIG. 3 is a circuit diagram of a bit line load circuit in accordance with a second embodiment of the present invention.

Referring to FIG. 3, there is shown a circuit diagram of a bit line load circuit, in accordance with a second embodiment of the present invention. As shown in this drawing, the bit, line load circuit, has the bit, line loads in the form of NMOS. Some of parts in this drawing are the same as those in FIG. 2. Therefore, like reference numerals designate like parts.

The bit line load circuit comprises N-channel MOSFETs Q31 and Q32 for clamping the voltage difference between the bit lines B and /B at the predetermined level in the data reading operation. The N-channel MOSFET Q31 has a source connected to the bit line B, a drain connected to the power source line Vcc and a gate connected to an inverted one /WE of the write enable signal WE. The N-channel MOSFET Q32 has a source connected to the bit line /B, a drain connected to the power source line Vcc and a gate connected to the inverted write enable signal /WE.

Also, the bit line load circuit comprises N-channel MOSFETs Q33 and Q34 for blocking a DC current flow to one of the bit lines B and /B having a "low" level and performing a voltage compensation for the other having a "high" level in the data writing operation. The N-channel MOSFET Q33 has a drain connected to the power source line Vcc, a source connected to the bit line B and a gate cross-connected to the bit line /B through an inverter I2. The N-channel MOSFET Q34 has a drain connected to the power source line Vcc, a source connected to the bit line /B and a gate cross-connected to the bit line B through an inverter I1. Namely, the N-channel MOSFETs Q33 and Q34 are in the form of cross-coupled loads through the inverters I1 and I2. The operating principle of the second embodiments of the present invention is the same as that in FIG. 2 and a detailed description thereof will thus be omitted.

Figure 4:
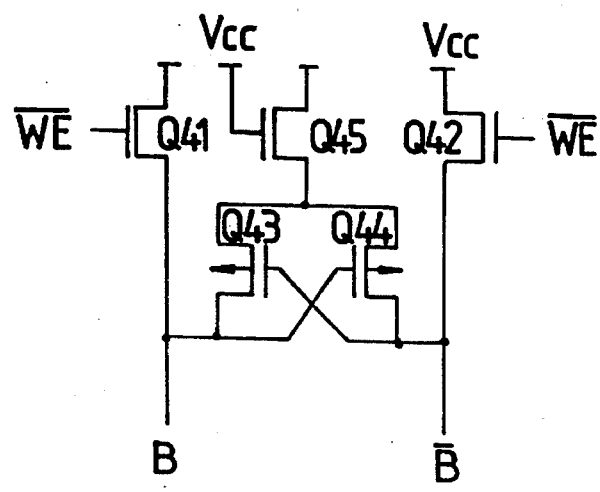
FIG. 4 is a circuit diagram of a bit line load circuit in accordance with a third embodiment of the present invention.

Referring to FIG. 4, there is shown a circuit, diagram of a bit, line load circuit, in accordance with a third embodiment of the present, invention. Similarly to that, in FIG. 3, the bit line load circuit, has the bit, line loads in the form of NMOS. Some of parts in this drawing are the same as those in FIG. 3. Therefore, like reference numerals designate like parts.

The bit, line load circuit, comprises N-channel MOSFETs Q41 and Q42 for clamping t,he volt,age difference between the bit lines B and /B at, the predetermined level in the data reading operation. The N-channel MOSFET Q41 has a source connected to the bit, line B, a drain connected to the power source line Vcc and a gate connected to the inverted write enable signal /WE. The N-channel MOSFET Q42 has a source connected to the bit line /B, a drain connected to the power source line Vcc and a gate connected to the inverted write enable signal /WE.

Also, the bit, line load circuit, comprises a N-channel MOSFET Q45 having a gate and a drain connected in common to the power source line Vcc.

The bit, line load circuit, also comprises P-channel MOSFETs Q43 and Q44 for blocking a DC current, flow to one of the bit, lines B and /B having a "low" level and performing a voltage compensation for the other having a "high" level in the data writing operation. The P-channel MOSFET Q43 has a source connected to a source of the N-channel MOSFET Q45, a drain connected to the bit line B and a gate cross-connected to the bit line /B. The P-channel MOSFET Q34 has a source connected to the source of the N-channel MOSFET Q45, a drain connected to the bit line /B and a gate cross-connected to the bit line B. Namely, the P-channel MOSFETs Q33 and Q34 are in the form of cross-coupled loads, The operating principle of the third embodiment of the present invention is the same as that in FIG. 2. For example, in the case where the bit line B is "high" and the bit line /B is "low", the P-channel MOSFET Q43 is turned on to compensate for the voltage of the bit line B and the P-channel MOSFET Q44 is turned off to block the DC static current to the bit line /B.

Besides the above-mentioned embodiments, various modifications of the bit line load circuit of the present invention are possible using transistors under the control of the bit lines and write enable signal to block the DC current flow to one of the bit lines having a "low" level and perform the voltage compensation for the other having a "high" level.

As apparent from the above description, according to the present invention, the DC static current can perfectly be blocked in the data writing operation of the SRAM with no change in the function of the conventional bit line load circuit and with no increase in the number of MOSFETs thereof.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A bit line load circuit for a static random access memory comprising:

first and second N-channel MOSFETs for clamping a voltage difference between first and second bit lines at a predetermined level in a data reading operation, said first bit line being active "high", said second bit line being active "low", said first N-channel MOSFET having a source connected to said first bit line, a drain connected to a power source line and a gate connected to an inverted one of a write enable signal, said second N-channel MOSFET having a source connected to said second bit line, a drain connected to said power source line and a gate connected to the inverted write enable signal;

a third N-channel MOSFET having a gate and a drain connected in common to said power source line; and first and second P-channel MOSFETs for blocking a DC current flow to one of said first and second bit lines having a "low" level and performing a voltage compensation for the other having a "high" level in a data writing operation, said first P-channel MOSFET having a source connected to a source of said third N-channel MOSFET, a drain connected to said first bit line and a gate cross-connected to said second bit line, said second P-channel MOSFET having a source connected to the source of said third N-channel MOSFET, a drain connected to said second bit line and a gate cross-connected to said first bit line.

* * * * *